(12) United States Patent
Eason et al.

(10) Patent No.: US 11,469,079 B2
(45) Date of Patent: Oct. 11, 2022

(54) ULTRAHIGH SELECTIVE NITRIDE ETCH TO FORM FINFET DEVICES

(71) Applicant: Lam Research Corporation, Fremont, CA (US)

(72) Inventors: Kwame Eason, East Palo Alto, CA (US); Dengliang Yang, Union City, CA (US); Pilyeon Park, Santa Clara, CA (US); Faisal Yaqoob, Fremont, CA (US); Joon Hong Park, Dublin, CA (US); Mark Kawaguchi, San Carlos, CA (US); Ivelin Angelov, San Jose, CA (US); Ji Zhu, Castro Valley, CA (US); Hsiao-Wei Chang, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 147 days.

(21) Appl. No.: 15/458,292

(22) Filed: Mar. 14, 2017

(65) Prior Publication Data

US 2018/0269070 A1    Sep. 20, 2018

(51) Int. Cl.
*H01J 37/32*  (2006.01)
*H01L 21/311*  (2006.01)
(Continued)

(52) U.S. Cl.
CPC ...... *H01J 37/32449* (2013.01); *H01J 37/321* (2013.01); *H01J 37/3211* (2013.01);
(Continued)

(58) Field of Classification Search
CPC ........... C23C 16/4558; H01L 21/31116; H01L 21/67069; H01L 21/823431;
(Continued)

(56) References Cited

U.S. PATENT DOCUMENTS

| | | | | | |
|---|---|---|---|---|---|
| 4,793,897 | A | * | 12/1988 | Dunfield | C23F 4/00 204/192.37 |
| 5,202,008 | A | * | 4/1993 | Talieh | B08B 7/0007 204/192.32 |

(Continued)

OTHER PUBLICATIONS

Kumar et al, Selective Reactive Ion Etching of PECVD Silicon Nitride over Amorphous Silicon in CF4/H2 and Nitrogen Containing CF4/H2 Plasma Gas Mixtures, 1996, Solid State electronics, vol. 39 No. 1, pp. 33-37 (Year: 1996).*

(Continued)

*Primary Examiner* — Benjamin Kendall (57) ABSTRACT

A substrate processing system for selectively etching a layer on a substrate includes an upper chamber region, an inductive coil arranged around the upper chamber region and a lower chamber region including a substrate support to support a substrate. A gas distribution device is arranged between the upper chamber region and the lower chamber region and includes a plate with a plurality of holes. A cooling plenum cools the gas distribution device and a purge gas plenum directs purge gas into the lower chamber. A surface to volume ratio of the holes is greater than or equal to 4. A controller selectively supplies an etch gas mixture to the upper chamber and a purge gas to the purge gas plenum and strikes plasma in the upper chamber to selectively etch a layer of the substrate relative to at least one other exposed layer of the substrate.

13 Claims, 10 Drawing Sheets

(51) Int. Cl.
*H01L 21/8234* (2006.01)
*H01L 29/66* (2006.01)

(52) U.S. Cl.
CPC .... *H01J 37/3244* (2013.01); *H01J 37/32522* (2013.01); *H01J 37/32798* (2013.01); *H01L 21/31116* (2013.01); *H01L 21/823431* (2013.01); *H01J 2237/002* (2013.01); *H01J 2237/006* (2013.01); *H01J 2237/334* (2013.01); *H01L 29/66795* (2013.01)

(58) Field of Classification Search
CPC .. H01L 29/66795; H01J 37/321–32165; H01J 37/32357; H01J 37/32449; H01J 37/32798; H01J 2237/002; H01J 2237/006; H01J 2237/334; H01J 37/32–3299; H05H 2001/4652–4667
See application file for complete search history.

(56) References Cited

U.S. PATENT DOCUMENTS

| | | | | |
|---|---|---|---|---|
| 5,627,435 | A * | 5/1997 | Jansen | H01J 37/32009 118/723 MA |
| 6,270,862 | B1 * | 8/2001 | McMillin | C23C 16/455 427/569 |
| 6,486,081 | B1 * | 11/2002 | Ishikawa | C23C 16/401 438/787 |
| 7,879,179 | B2 * | 2/2011 | Otsuki | C23C 16/4404 118/723 R |
| 8,193,096 | B2 * | 6/2012 | Goto | C01B 3/00 438/706 |
| 9,318,581 | B1 * | 4/2016 | Guo | H01L 29/7853 |
| 2001/0003014 | A1 * | 6/2001 | Yuda | C23C 16/45565 118/723 E |
| 2002/0000202 | A1 * | 1/2002 | Yuda | C23C 16/402 118/723 ER |
| 2002/0092471 | A1 * | 7/2002 | Kang | C23C 16/4583 118/715 |
| 2004/0007561 | A1 * | 1/2004 | Nallan | H01L 21/31122 216/67 |
| 2004/0219790 | A1 * | 11/2004 | Wilson | H01L 21/31116 438/691 |
| 2008/0178805 | A1 * | 7/2008 | Paterson | H01J 37/32091 118/723 I |
| 2014/0256128 | A1 * | 9/2014 | Spurlin | H01L 21/76861 438/643 |
| 2016/0064519 | A1 * | 3/2016 | Yang | H01L 21/02068 438/712 |
| 2016/0233335 | A1 * | 8/2016 | Dasaka | H01L 29/165 |
| 2017/0032982 | A1 | 2/2017 | Drewery et al. | |
| 2017/0092544 | A1 * | 3/2017 | Cheng | H01L 21/823431 |
| 2017/0200586 | A1 | 7/2017 | Treadwell et al. | |

OTHER PUBLICATIONS

Kastenmeier et al, Highly Selective Etching of Silicon Nitride over Silicon and Silicon Dioxide, 1999, J. Vac. Sci. Technol. A., vol. 17 No. 6, 3179-3184 (Year: 1999).*

* cited by examiner

ULTRAHIGH SELECTIVE NITRIDE ETCH TO FORM FINFET DEVICES

FIELD

The present disclosure relates to substrate processing devices, and more particularly to selective etching of silicon nitride.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

When integrating some semiconductor substrates such as fin field effect transistor (FinFET) devices, silicon nitride film needs to be etched with very high selectivity to other exposed film materials. For example, dummy nitride films that are used during integration of FinFET devices need to be selectively etched.

Hot phosphoric acid is the main chemistry that is used for etching silicon nitride film in these devices. Hot phosphoric acid has several limitations including meeting selectivity requirements for epitaxial silicon (epi-Si), silicon phosphorous (SiP) and silicon germanium (SiGe) beyond 10 nm node, particle and defect control, pattern collapsing from surface tension, and surface depletion of carbon (C) from silicon oxycarbonitride (SiOCN) film.

SUMMARY

A substrate processing system for selectively etching a layer on a substrate includes an upper chamber region, an inductive coil arranged around the upper chamber region and a lower chamber region including a substrate support to support a substrate. A gas distribution device is arranged between the upper chamber region and the lower chamber region and includes a plate with a plurality of holes in fluid communication with the upper chamber region and the lower chamber region. A surface to volume ratio of the holes is greater than or equal to 4. An RF generator supplies RF power to the inductive coil. A gas delivery system selectively supplies gas mixtures. A controller is configured to cause the gas delivery system to selectively supply an etch gas mixture to the upper chamber and to strike plasma in the upper chamber to selectively etch a layer of the substrate relative to at least one other exposed layer of the substrate.

In other features, the gas distribution device includes a cooling plenum that circulates fluid in the gas distribution device to control a temperature of the gas distribution device and a purge gas plenum to direct purge gas through the gas distribution device into the lower chamber.

In other features, the controller is further configured to transition the plasma to a post etch gas mixture after a predetermined etch period. The post etch gas mixture includes a hydrogen species and an oxide species. The controller is configured to transition the plasma from the etch gas mixture to the post etch gas mixture without extinguishing the plasma.

In other features, a thickness of the plate is in a range from 5 mm to 25 mm, a diameter of the holes is in a range from 1 mm to 5 mm, a number of the holes is in a range from 100 to 5000, and a diameter of the plate is in a range from 6" to 20".

In other features, the layer of the substrate includes silicon nitride that is etched selectively relative to the at least one other exposed layer. The at least one other exposed layer is selected from a group consisting of silicon dioxide ($SiO_2$), silicon oxycarbonitride (SiOCN), silicon germanium (SiGe), amorphous silicon (a-Si) and epitaxial-silicon (epi-Si). In other features, the etch gas mixture includes gases promoting nitride etch and passivation of at least one of silicon (Si), silicon germanium (SiGe) and oxide. The gases promoting nitride etch include one or more gases selected from a group consisting of nitrogen trifluoride ($NF_3$), difluoromethane ($CH_2F_2$), tetrafluoromethane ($CF_4$), fluoromethane ($CH_3F$), a combination of molecular oxygen, molecular nitrogen, and nitrous oxide ($O_2/N_2/N_2O$), and combinations thereof. The gases promoting passivation include one or more gases selected from a group consisting of fluoromethane ($CH_3F$), difluoromethane ($CH_2F_2$), methane ($CH_4$), carbonyl sulfide (COS), hydrogen sulfide ($H_2S$), a combination of molecular oxygen, molecular nitrogen, and nitrous oxide ($O_2/N_2/N_2O$), and combinations thereof.

A substrate processing system for selectively etching a layer on a substrate includes a substrate processing chamber including an upper chamber region and a lower chamber region including a substrate support to support a substrate. A gas distribution device is arranged between the upper chamber region and the lower chamber region and includes a plurality of holes in fluid communication with the upper chamber region and the lower chamber region. A surface to volume ratio of the holes is greater than or equal to 4. A plasma supply at least one of generates plasma in or supplies plasma to the upper chamber region to selectively etch a layer of the substrate relative to at least one other exposed layer of the substrate.

In other features, the gas distribution device includes a cooling plenum for circulating fluid in a portion of the gas distribution device to control a temperature of the gas distribution device. The gas distribution device further includes a purge gas plenum to direct purge gas from the gas distribution device in a direction into the lower chamber towards the substrate support. The gas distribution device includes a cooling plenum to circulate fluid to control a temperature of the gas distribution device; and a purge gas plenum to direct purge gas from the gas distribution device into the lower chamber.

In other features, a thickness of the gas distribution device is in a range from 5 mm to 25 mm and a diameter of the holes is in a range from 1 mm to 5 mm. A number of the holes is in a range from 100 to 5000 and a diameter of the gas distribution device is in a range from 6" to 20". The layer of the substrate includes silicon nitride that is etched selectively relative to the at least one other exposed layer. The at least one other exposed layer is selected from a group consisting of silicon dioxide ($SiO_2$), silicon oxycarbonitride (SiOCN), silicon germanium (SiGe), amorphous silicon (a-Si) and epitaxial-silicon (epi-Si).

In other features, the plasma supply generates the plasma using a plasma gas mixture including gases promoting nitride etch and promoting passivation of at least one of silicon (Si), silicon germanium (SiGe) and oxide. The gases promoting nitride etch include one or more gases selected from a group consisting of nitrogen trifluoride ($NF_3$), difluoromethane ($CH_2F_2$), tetrafluoromethane ($CF_4$), fluoromethane ($CH_3F$), a combination of molecular oxygen, molecular nitrogen, and nitrous oxide ($O_2/N_2/N_2O$), and combinations thereof. The gases promoting passivation include one or more gases selected from a group consisting of fluoromethane ($CH_3F$), difluoromethane ($CH_2F_2$), methane ($CH_4$), carbonyl sulfide (COS), hydrogen sulfide ($H_2S$), a combination of molecular oxygen, molecular nitrogen, and nitrous oxide ($O_2/N_2/N_2O$), and combinations thereof.

A method for selectively etching a layer on a substrate includes providing a substrate processing chamber including a gas distribution device arranged between an upper chamber region and a lower chamber region. The lower chamber region includes a substrate support to support a substrate. The gas distribution device includes a plate including a plurality of holes in fluid communication with the upper chamber region and the lower chamber region. A surface to volume ratio of the holes is greater than or equal to 4. The method further includes supplying an etch gas mixture to the upper chamber region. The method further includes striking plasma in the upper chamber region to selectively etch a layer of the substrate relative to at least one other exposed layer of the substrate.

In other features, the method includes supplying fluid to a cooling plenum in the gas distribution device to control a temperature of the gas distribution device and purge gas to a purge gas plenum in the gas distribution device. The purge gas plenum directs the purge gas from the gas distribution device towards the substrate support.

In other features, the method includes transitioning the plasma to a post etch gas mixture after a predetermined etch period. The post etch gas mixture includes a hydrogen species and an oxide species. The transitioning from the etch gas mixture to the post etch gas mixture is performed without extinguishing the plasma. A thickness of the plate is in a range from 5 mm to 25 mm, a diameter of the holes is in a range from 1 mm to 5 mm, a number of the holes is in a range from 100 to 5000 and a diameter of the plate is in a range from 6" to 20".

In other features, the layer of the substrate includes silicon nitride that is etched selectively relative to the at least one other exposed layer. The at least one other exposed layer is selected from a group consisting of silicon dioxide ($SiO_2$), silicon oxycarbonitride (SiOCN), silicon germanium (SiGe), amorphous silicon (a-Si) and epitaxial-silicon (epi S).

In other features the etch gas mixture includes gases promoting nitride etch and passivation of at least one of silicon (Si), silicon germanium (SiGe) and oxide. The gases promoting nitride etch include one or more gases selected from a group consisting of nitrogen trifluoride ($NF_3$), difluoromethane ($CH_2F_2$), tetrafluoromethane ($CF_4$), fluoromethane ($CH_3F$), a combination of molecular oxygen, molecular nitrogen, and nitrous oxide ($O_2/N_2/N_2O$), and combinations thereof. The gases promoting passivation include one or more gases selected from a group consisting of fluoromethane ($CH_3F$), difluoromethane ($CH_2F_2$), methane ($CH_4$), carbonyl sulfide (COS), hydrogen sulfide ($H_2S$), a combination of molecular oxygen, molecular nitrogen, and nitrous oxide ($O_2/N_2/N_2O$), and combinations thereof.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

This present disclosure relates to a process that generates radicals to promote nitride etch while selectively passivating films other than silicon nitride. The process is thermodynamically in equilibrium between adsorption of radicals to a surface and desorption of reactants from the surface. The high radical generation results in high SiN removal rate with low across-wafer variation. Radical generation may be modulated by power, pressure, chemistry and/or gas dilution. In some examples, the radicals are generated in an H-mode plasma state (rather than an E-mode plasma state) to provide high radical dissociation for surface passivation.

The process selectively removes silicon nitride relative to other exposed films such as silicon dioxide ($SiO_2$), silicon oxycarbonitride (SiOCN) spacer material, silicon germanium (SiGe), amorphous silicon (a-Si) and epitaxial-silicon (epi-Si). The process is residue free, leaves no solid by-products, and allows for a de-fluorination of surfaces after etch. The process enables a fully dry etch process, without pattern collapse in high aspect ratio 3-D structures.

In some examples, the process uses an inductively coupled plasma (ICP) source to generate radicals and ions. In some examples, a capacitive coupled plasma (CCP) source is used to selectively generate radicals.

The plasma includes ions that physically etch the substrate and radicals that chemically etch the substrate.

Improved selectivity can be achieved by reducing or eliminating ions and high energy radicals. While the use of downstream plasma may reduce or eliminate the ions, the high energy radicals may still cause undesirable loss of film. Systems and methods described herein are used to reduce or filter high energy tails of the radicals to decrease the undesired film loss.

As will be described further below, systems and methods according to the present disclosure reduce the radical energy using one or more features. The gas distribution device can be designed to deliver gas via holes having a predetermined surface to volume (S/V) ratio. A temperature of the gas distribution device can be stabilized and uniformly controlled using a fluid plenum through which fluid (such as liquid or gas) flows. Purge gas can be introduced into a lower chamber below the gas distribution device using another Plenum in the gas distribution device. A gap between the substrate and the gas distribution device can be modulated to improve selectivity.

Figure 1:
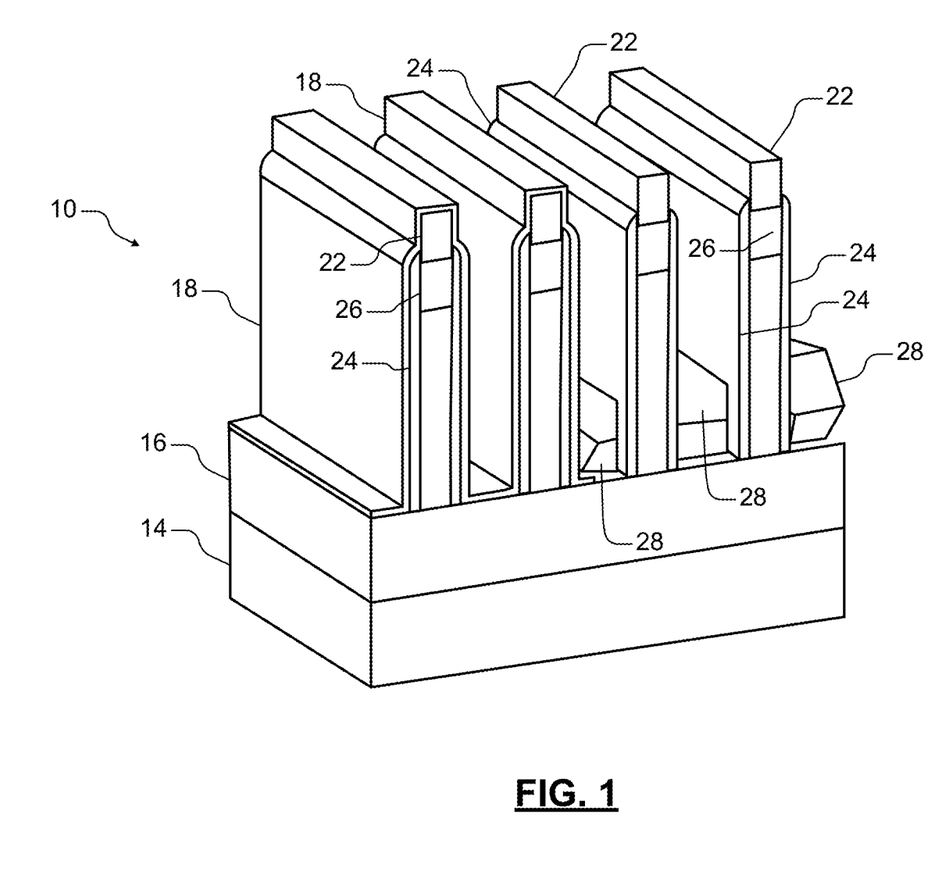
FIG. 1 is a perspective view of an example of a FinFET device during selective etching of a silicon nitride film according to the present disclosure.

Referring now to FIG. 1, an example of a FinFET device 10 is shown. While FinFET devices are described herein, the selective etching process can be used on other devices. The FinFET device 10 includes an amorphous silicon layer 14 and a silicon dioxide ($SiO_2$) layer 16. A silicon nitride layer 18 is arranged over a $SiO_2$ spacer or layer 22, a low k spacer 24 and a SiN spacer or layer 26. The FinFET device 10 may also include silicon germanium (SiGe) 28. During etching of the SiN layer 18, various different film types are exposed to the etching including $SiO_2$ film, low k film, and SiGe film. Etching the SiN film needs to be performed without damage or substantial removal of the $SiO_2$ film, low k film, and/or SiGe film. In addition to these types of film, the substrate may also include other film materials such as silicon oxycarbonitride (SiOCN) and/or epi-Si that may be exposed during etching.

Figure 2:
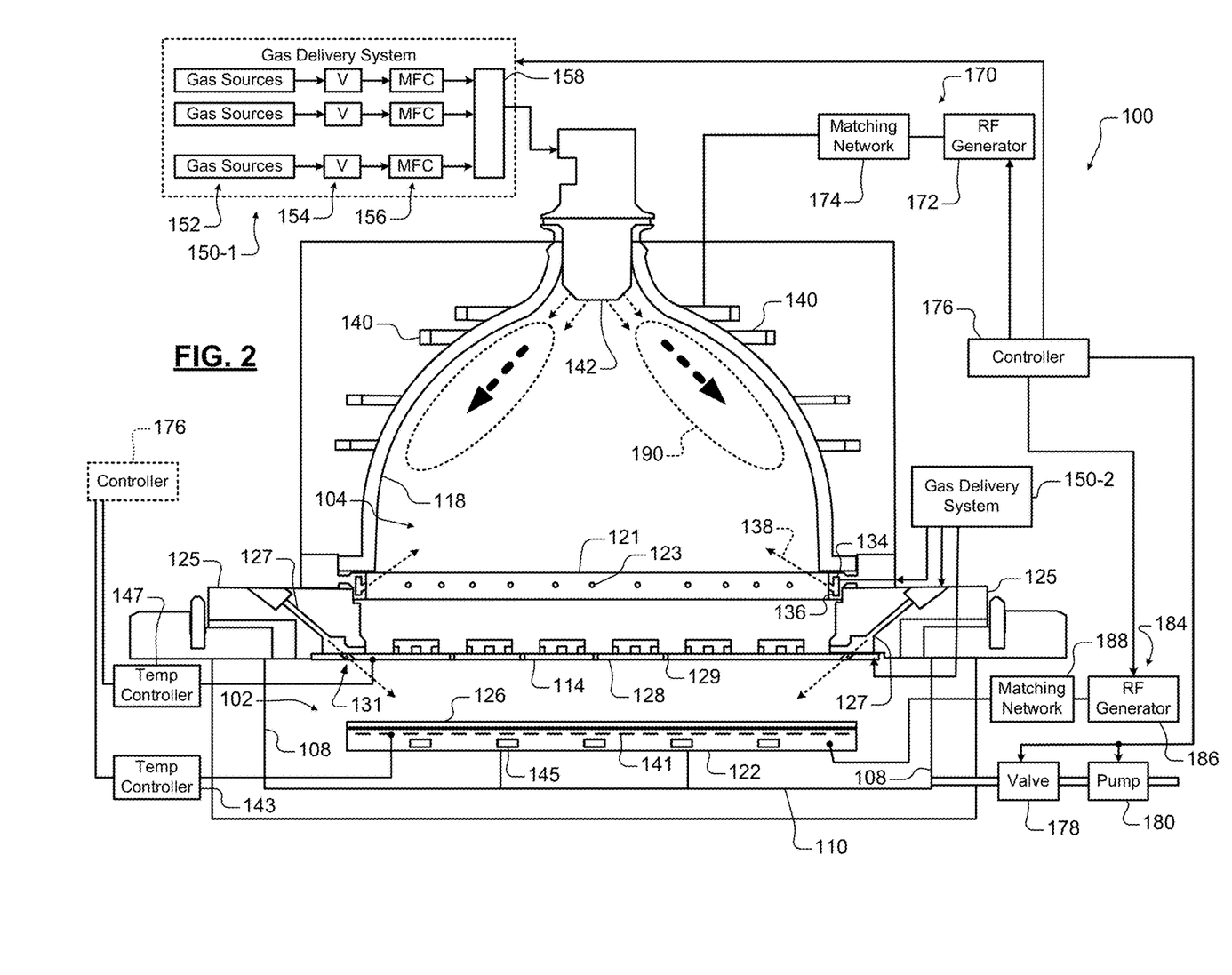
FIG. 2 is a functional block diagram of an example of an inductively coupled plasma (ICP) substrate processing chamber for selectively etching silicon nitride film according to the present disclosure.

Referring now to FIG. 2, an example of a substrate processing chamber 100 for selectively etching SiN film of a substrate according to the present disclosure is shown. While a specific substrate processing chamber is shown and described, the methods described herein may be implemented on other types of substrate processing systems. In some examples, the substrate processing chamber 100 includes a downstream inductively coupled plasma (ICP) source. An optional capacitively coupled plasma (CCP) source may be provided.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114. In some examples, the gas distribution device 114 is omitted.

The upper chamber region 104 is defined by an upper surface of the gas distribution device 114 and an inner surface of a upper chamber wall 118 (for example a dome-shaped chamber). In some examples, the upper chamber wall 118 rests on a first annular support 121. In some examples, the first annular support 121 includes one or more gas flow channels and/or holes 123 for delivering process gas to the upper chamber region 104, as will be described further below. The gas flow channels and/or holes 123 may be uniformly spaced around a periphery of the upper chamber region 104. In some examples, the process gas is delivered by the one or more gas flow channels and/or holes 123 in an upward direction at an acute angle relative to a plane including the gas distribution device 114, although other angles/directions may be used. In some examples, a plenum 134 in the first annular support 121 supplies gas to the one or more spaced gas flow channels and/or holes 123.

The first annular support 121 may rest on a second annular support 125 that defines one or more gas flow channels and/or holes 127 for delivering process gas to the lower chamber region 102. In some examples, holes 131 in the gas distribution device 114 align with the gas flow channels and/or holes 127. In other examples, the gas distribution device 114 has a smaller diameter and the holes 131 are not needed. In some examples, the process gas is delivered by the one or more spaced gas flow channels and/or holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 141, an optional cooling plate with fluid channels and one or more sensors (not shown); although any other suitable substrate support temperature control system may be used. In some examples, a temperature controller 143 may be used to control heating and cooling of the substrate support 122. Heating may be performed by the heater plate 141 and cooling may be performed by the cooling plate with fluid channels 145.

A temperature controller 147 may be used to control a temperature of the gas distribution device 114 by supplying heating/cooling fluid to a plenum in the gas distribution device 114. The temperature controllers 143 and/or 147 may further include a source of fluid, a pump, control valves and a temperature sensor (all not shown).

In some examples, the gas distribution device 114 includes a showerhead (for example, a plate 128 having a plurality of spaced holes 129). The plurality of spaced holes 129 extend from the upper surface of the plate 128 to the lower surface of the plate 128. In some examples, the spaced holes 129 have a diameter in a range from 0.4" to 0.75" and the showerhead is made of a conducting material such as aluminum or a non-conductive material such as ceramic with an embedded electrode made of a conducting material. In other examples described further below, smaller holes 129 can be used to increase the surface to volume ratio.

One or more inductive coils 140 are arranged around an outer portion of the upper chamber wall 118. When energized, the one or more inductive coils 140 create an electromagnetic field inside of the upper chamber wall 118. In some examples, an upper coil and a lower coil are used. A gas injector 142 injects one or more gas mixtures from a gas delivery system 150-1 into the upper chamber region 104.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas, tuning gas, purge gas or other gas mixtures to the gas flow channels and/or holes 123 and/or 127 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-2 delivers tuning gas to the gas flow channels and/or holes 123 and 127 and/or to other locations in the processing chamber as will be described below. For example, the gas delivery system 150-2 can also deliver gas to a plenum in the gas distribution device 114 (described below in conjunction with FIG. 11).

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, tuning gas, RF plasma and chamber pressure. In some examples, plasma is sustained inside the upper chamber wall 118 by the one or more inductive coils 140. One or more gas mixtures are introduced from a top portion of the chamber using the gas injector 142 (and/or gas flow channels and/or holes 123) and plasma is confined within the upper chamber wall 118 using the gas distribution device 114.

Confining the plasma in the upper chamber wall 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the upper chamber wall 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

In some examples, the plasma gas mixture includes gases promoting nitride etch and Si, SiGe and oxide passivation. Gases for promoting nitride etch include one or more of nitrogen trifluoride ($NF_3$), difluoromethane ($CH_2F_2$), tetrafluoromethane ($CF_4$), fluoromethane ($CH_3F$), a combination of molecular oxygen, molecular nitrogen, and nitrous oxide ($O_2/N_2/N_2O$), and combinations thereof. In some examples, gases for promoting oxide passivation include one or more of methane ($CH_4$), $CH_3F$, $CH_2F_2$, carbonyl sulfide (COS), hydrogen sulfide ($H_2S$), and/or $O_2/N_2/N_2O$. In some examples, gases for promoting silicon and SiGe passivation include one or more of $O_2/N_2/N_2O$, $N_2O$, or $O_2/N_2$. In some examples, argon (Ar) may be provided in the plasma gas chemistry to provide a carrier gas effect and to increase plasma density. Ar has a low electron affinity. In some examples, Ar is supplied in a range of 0% to 15% of the plasma gas mixture supplied during etching.

Suitable flow rates for various gases is shown below:

| Gas | Typical Flow (sccm) | Range (sccm) |
| --- | --- | --- |
| $NF_3$ | 100 | 0-500 |
| $CH_2F_2$ | 100 | 0-500 |
| $CF_4$ | 100 | 0-500 |
| $CH_3F$ | 100 | 0-500 |
| $CHF_3$ | 100 | 0-500 |
| $CH_4$ | 100 | 0-500 |
| $SiF_4$ | 100 | 0-500 |
| $SF_6$ | 100 | 0-500 |
| $H_2$ | 1000 | 0-3000 |
| COS | 100 | 0-500 |
| $H_2S$ | 100 | 0-500 |
| Ar | 2000 | 1000-5000 |
| $O_2$ | 3000 | 1000-5000 |
| $N_2$ | 3000 | 1000-5000 |
| $N_2O$ | 5000 | 1000-8000 |
| $CO_2$ | 100 | 0-5000 |

In some examples, a post etch treatment is performed to de-fluorinate final surfaces. In some examples, transition from etching to post etch treatment is made without extinguishing the plasma. In some examples, the post etch treatment includes a hydrogen containing species and an oxide containing species. Examples of hydrogen sources include, but not limited to: $H_2$, $NH_3$, $CH_4$, $C_2H_4$, $C_3H_6$, $C_2H_6$, etc. Examples of oxygen sources include, but not limited to: $O_2$, $CO_2$, $N_2O$, $H_2O$, $O_3$, etc. In some examples, the H source is supplied in a range from 25% to 75% and the oxygen source is supplied in a range from 75% to 25%. In some examples, the post etch treatment is performed for a predetermined period.

The etching process described above is highly selective to SiN. Selectivity relative to other film materials that can be obtained includes:

| Parameter | Selectivity |
| --- | --- |
| SiN/PE Ox | ≥100 |
| SiN/spacer low k | 10-100 |

| Parameter | Selectivity |
|---|---|
| SiN/SiGe | 10-100 |
| SiN/Epi Si | 10-100 |

The proposed process has several advantages including an all dry removal process that is capable of increasing FinFET scaling to higher aspect ratios and increased density. The process has higher manufacturing throughput and lower defects as compared to existing technology.

Figure 3:
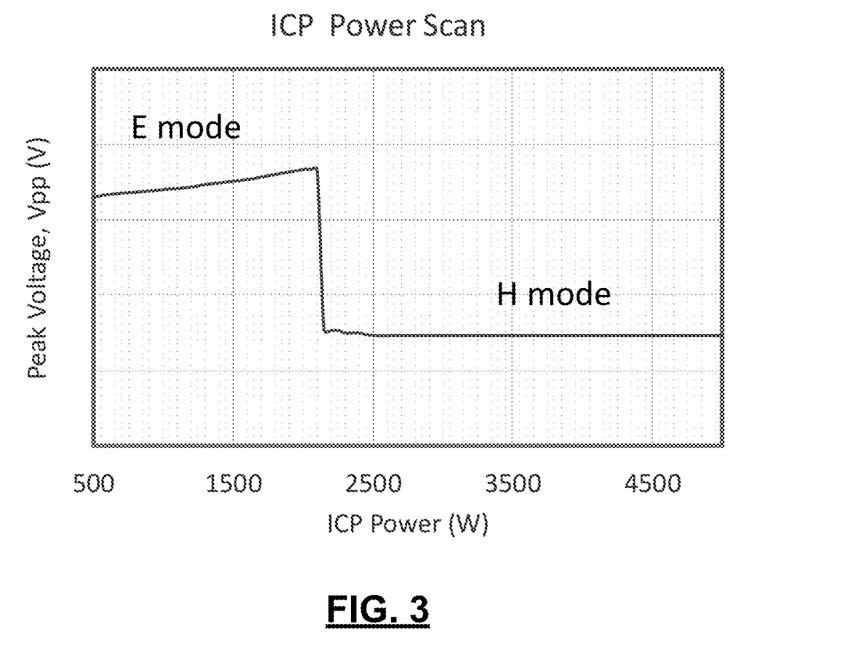
FIGS. 3-4 are graphs showing peak voltage as a function of ICP power for various different types of plasma and pressures according to the present disclosure.
Figure 4:
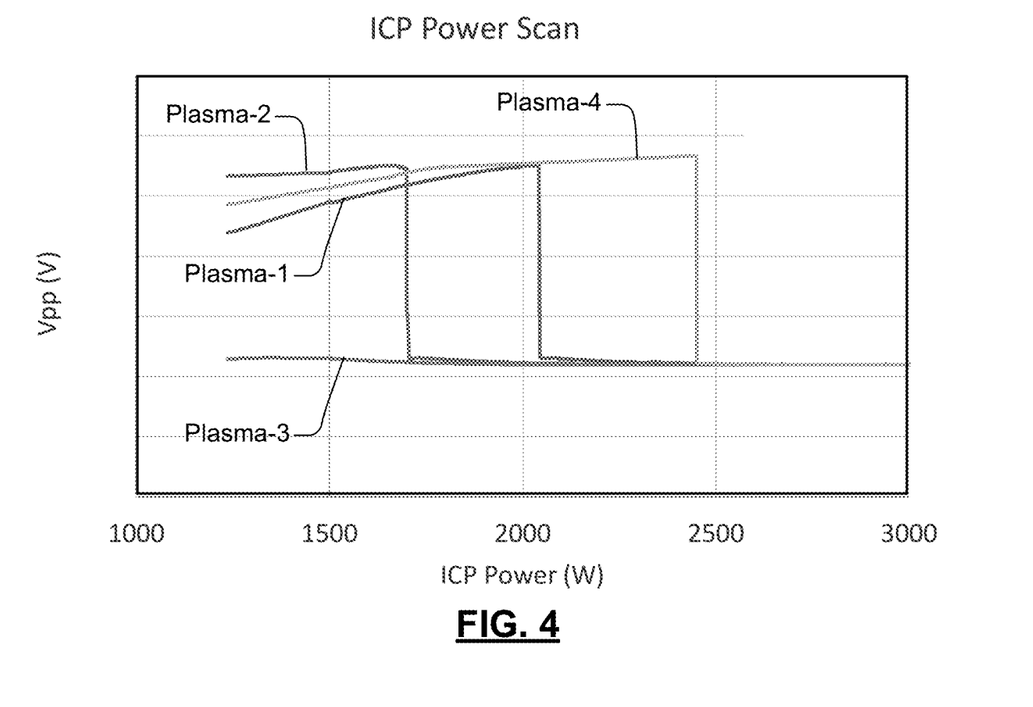

Referring now to FIGS. 3-4, as ICP power increases, the plasma transitions from the E-mode plasma state to the H-mode plasma state. A power level where the E to H mode transition occurs is affected by pressure, chemistry (the particular F gas species used), and chemistry of other gases in the mixture (e.g. addition of low electron affinity gases such as Ar). The etching mechanism leaves surface nominally F terminated. In some examples, a post etch treatment is performed as will be described below.

For the example in FIG. 3, the E to H mode transition occurs at about 2200 W of ICP power. In FIG. 4, the E to H mode transition for other plasma gas chemistry is shown. Plasma-1 corresponds to a plasma gas mixture of $N_2O$, $O_2$, $N_2$, $CO_2$, and $NF_3$. $NF_3$ is a strong electronegative species. Plasma-2 corresponds to a plasma gas mixture of $N_2O$, $O_2$, $N_2$, $CO_2$, $NF_3$ and Ar. Ar has a low electron affinity. Plasma-3 corresponds to a plasma gas mixture of $N_2O$, $O_2$, $N_2$, $CO_2$, Ar and $CF_4$. $CF_4$ is a weak electronegative F species. Plasma-4 corresponds to a plasma gas mixture of $N_2O$, $O_2$, $N_2$, $CO_2$, and $NF_3$ at high pressure. As can be seen in FIG. 4, the transition to H mode varies depending upon the gas chemistry, ICP chamber pressure and ICP power.

In some examples, the mechanism for the silicon nitride etching occurs in three steps: first chemisorption of radicals on the surface, followed by desorption of products from the surface, finally leading to a fluorination step. During chemisorption, radicals from downstream plasma attach to nitrogen atom of the nitride. During desorption, the desorption rate is high for the by-product species, essentially serving as an N extraction process. During fluorination, silicon in the nitride is removed by F reactions. In contrast, the radicals from the downstream plasma attach to oxide. The desorption rate is very low on oxide. The oxide is protected from F attack by the radicals.

Figure 5:
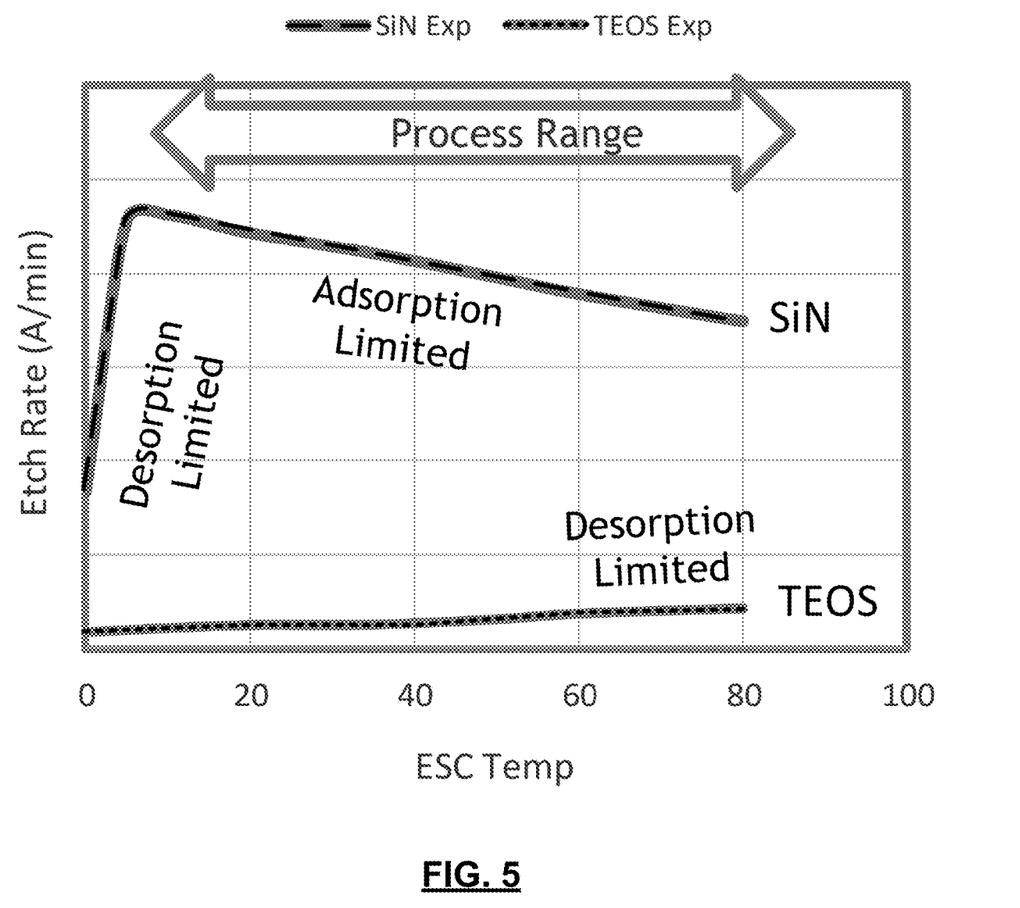
FIG. 5 illustrates etch rate as a function of substrate support temperature for the ICP processing chamber according to the present disclosure.

Referring now to FIG. 5, differential etch rates for SiN and $SiO_2$ (for example using tetraethyl orthosilicate (TEOS)) are shown. Radical flux helps achieve high etch rate and high selectivity.

Figure 6:
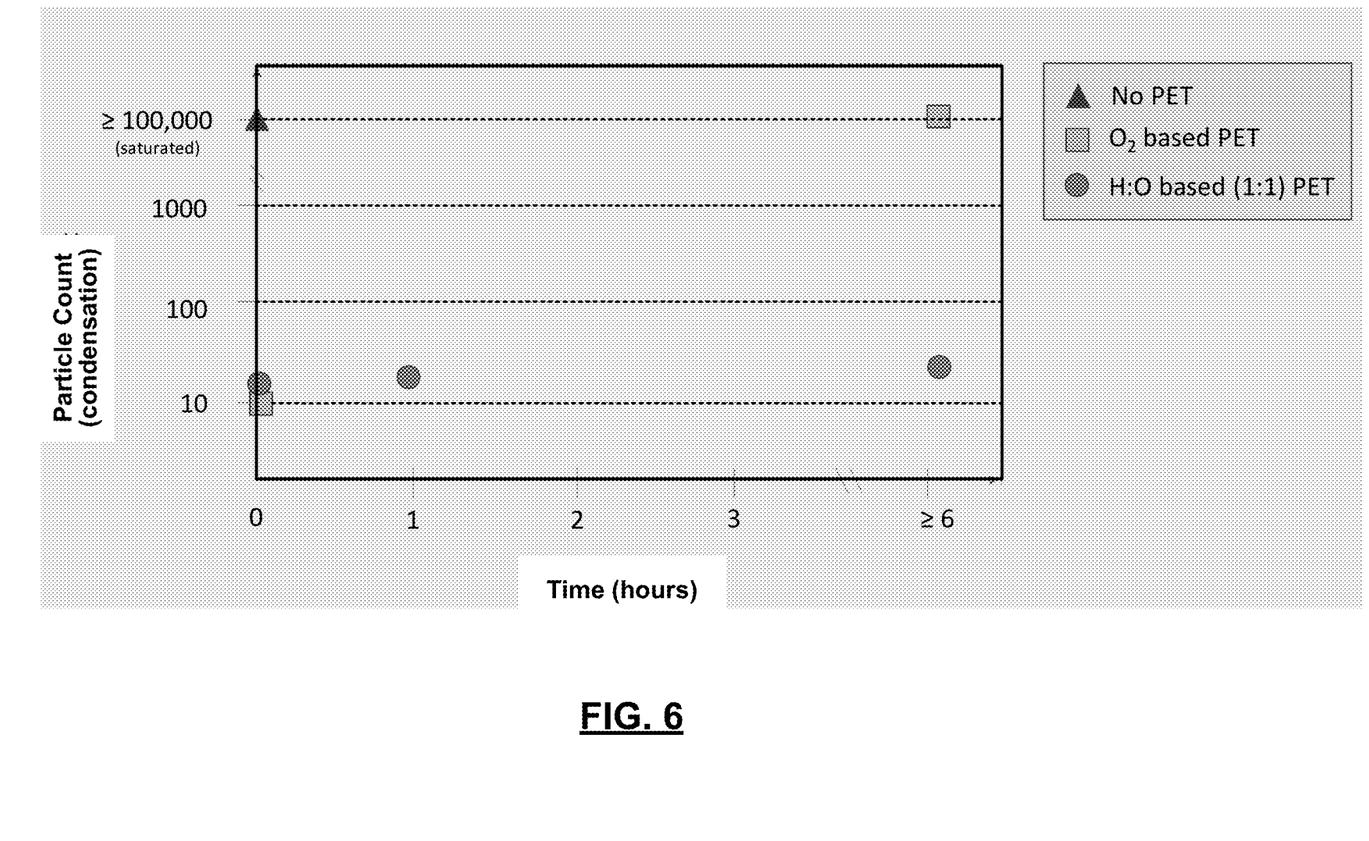
FIG. 6 illustrates substrates without post etch treatment, with $O_2$ post etch treatment, and with H:O post etch treatment according to the present disclosure.

In FIG. 6, a graph of particle performance is shown for SiN etch with 1) no post etch treatment (PET), 2) treatment with oxygen only PET, and 3) treatment with oxygen and hydrogen PET (1:1 ratio). In some examples, the $O_2$-based plasma is marginally effective since condensation increased over time as can be seen in FIG. 6. In some examples, the $H_2/O_2$-based plasma with ratios of 1:1 is effective since condensation was stable over time as can be seen in FIG. 6.

Figure 7:
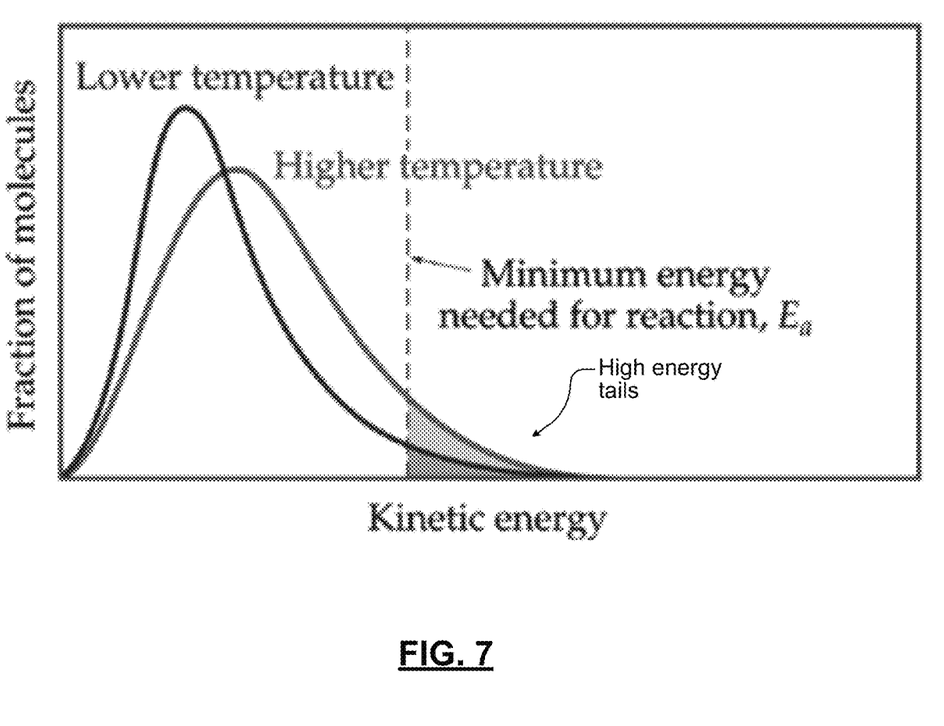
FIG. 7 is a graph illustrating an example of kinetic energy as a function of a fraction of molecules at higher and lower temperatures.

Referring now to FIG. 7, the plasma includes ions that physically etch the substrate and radicals that chemically etch the substrate. Improved selectivity can be achieved by reducing or eliminating ions and high energy radicals. While the use of downstream plasma may reduce or eliminate ions, the high energy radicals may still cause undesirable loss of film. Systems and methods described herein are used to reduce or filter high energy tails (as indicated in FIG. 7) of the radicals to decrease the undesired film loss.

Figure 8:
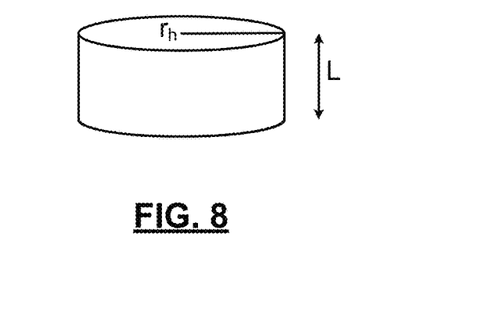
FIG. 8 illustrates an example of dimensions of a through hole formed in the plate of the gas distribution device.
Figure 9:
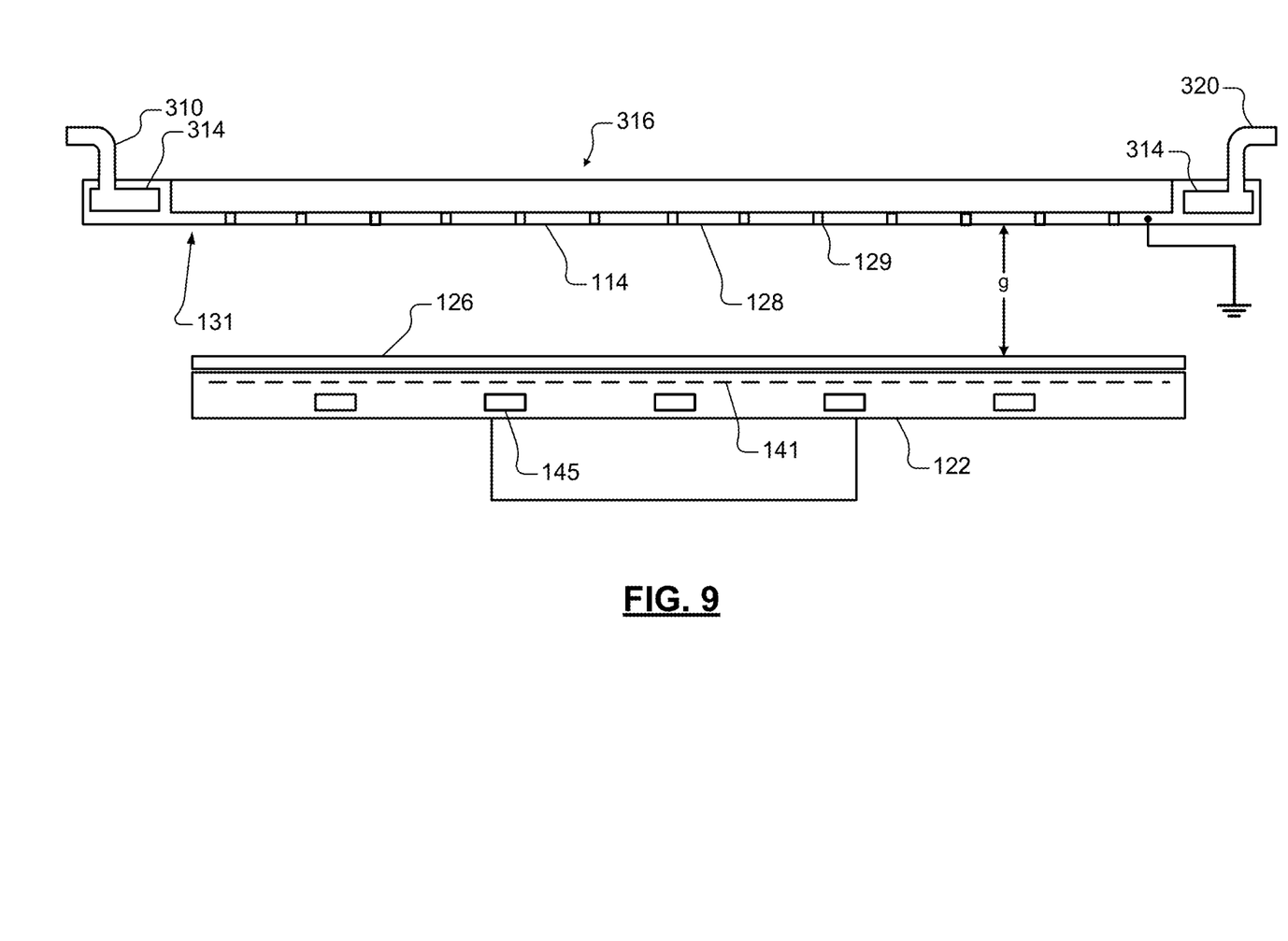
FIG. 9 is a side cross-sectional view of an example of a gas distribution device including a single plenum according to the present disclosure.

Systems and methods according to the present disclosure reduce the radical energy using one or more features. Referring now to FIGS. 8-9, the gas distribution device 114 can be designed to deliver gas using the plate 128 including the holes 129 having a predetermined surface to volume (S/V) ratio. Hole surface area of one of the holes is defined by $2\pi r_h * L$, where $r_h$ is the radius of the hole and L is the thickness of the gas distribution device. Hole volume for a single hole is defined by $\pi r_h^2 * L$. Therefore, the S/V ratio is given by:

$$\frac{S}{V} = \frac{2\pi r_h L N}{\pi r_h^2 L N} = \frac{2}{r_h}$$

where N is the number of holes.

The S/V ratio of the gas distribution device 114 according to the present disclosure is greater than or equal to 4. In some examples, the S/V ratio is greater than or equal to 5, 6, 7, 8, 9, 10, 11 or greater in units of (1/cm). A typical value for the S/V ratio for existing gas distribution devices is usually less than two. The higher S/V ratio increases an ion flux removal rate and a high thermal energy radical flux removal rate. In other words, the high energy tails are reduced. In some examples, the thickness of the gas distribution device is in a range from 5 mm to 25 mm. In some examples, the hole diameter is in a range from 1 mm to 5 mm as compared to a typical hole diameter in a range from 10 mm to 25 mm. In some examples, the thickness of the plate 128 is in a range from 5 mm to 25 mm. In some examples, the number of holes is in a range from 100 to 5000. The plate diameter is in a range from 6" to 20".

In FIG. 9, a temperature of the gas distribution device can be controlled using a gas distribution device including a fluid plenum through which fluid (such as liquid or gas) flows. A fluid inlet 310 receives fluid such as gas or liquid. The fluid inlet 310 is in fluid contact with a first plenum 314. The fluid flows into the fluid inlet 310, through the first plenum 314 (around a periphery of the gas distribution device 114) and out a fluid outlet 320. In some examples, the gas distribution device 114 includes an annular, radially-outer portion 316 in which the first plenum 314 is formed. In some examples, the annular, radially-outer portion 316 has a greater thickness in an axial direction than a radially inner portion of the gas distribution device 114. Fluid flowing through the first plenum 314 absorbs heat to cool the gas distribution device 114 or heat from the fluid is absorbed by the gas distribution device 114 to heat the gas distribution device 114. As a result, the temperature of the gas distribution device 114 is more uniform.

Figure 10:
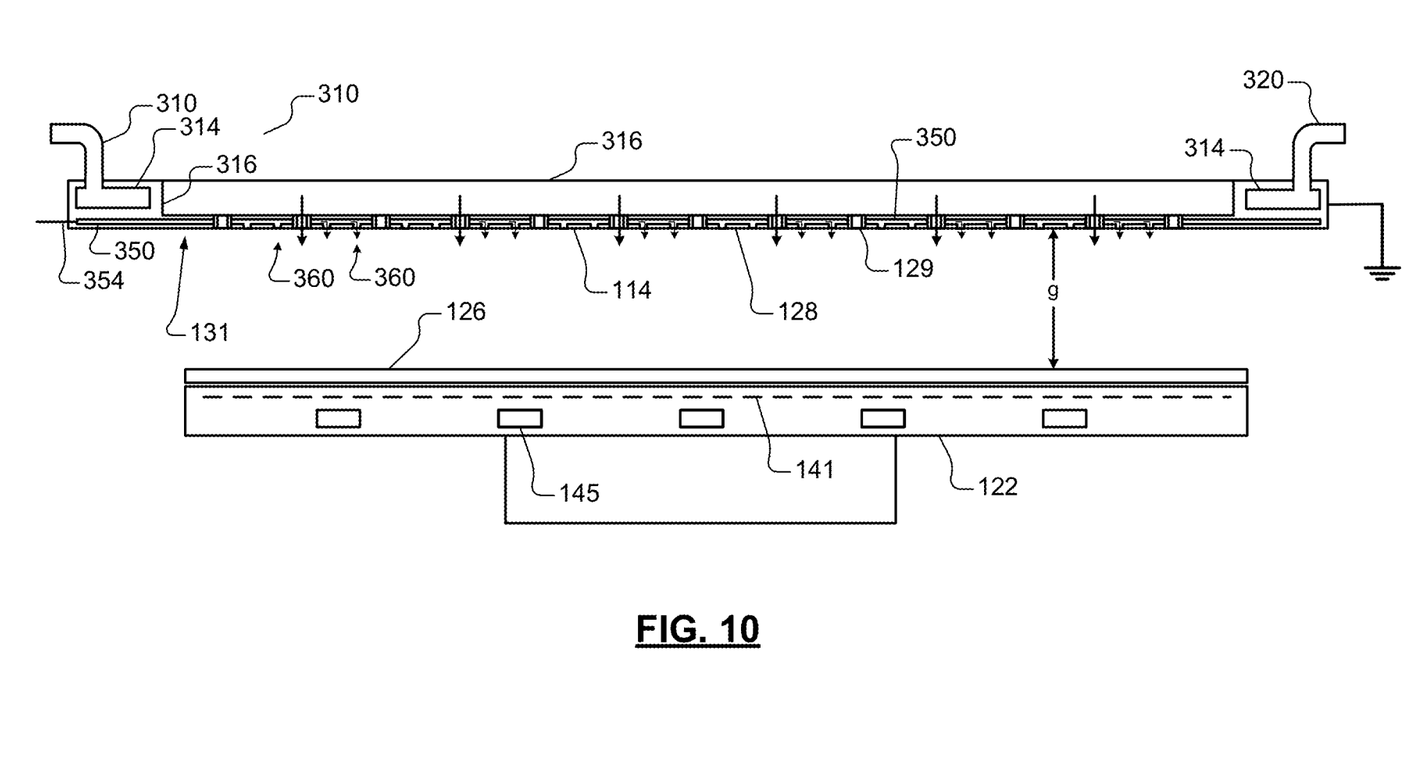
FIG. 10 is a side cross-sectional view of an example of a gas distribution device including dual plenums according to the present disclosure.

Referring now to FIG. 10, in some examples the gas distribution device 114 may include a second plenum 350 for delivering purge gas to the lower chamber region 102. In some examples, the second plenum 350 extends throughout a surface of the gas distribution device 114 located above the substrate 126. A gas inlet 354 to the second plenum 350 is connected to a source of purge gas such as the gas delivery system 150-2 described above. A plurality of gas holes 360 extend through a lower surface of the gas distribution device 114 to direct gas from the second plenum 350 downwardly towards the substrate 126. In some examples, the gas distribution device 114 can be made using two or more plates having facing surfaces that are machined to create one or both plenums and then the plates are connected together using seals, welding or other methods.

The purge gas is introduced into the lower chamber region 102 below the gas distribution device 114. The purge gas is cooler than the plasma gas. The purge gas mixes with downstream plasma gas to reduce overall gas temperature. Depending on the relative flow rates, the purge gas can reduce the temperature of the plasma gas reaching the substrate from 300° C. to less than 100° C. The temperature of $T_{mix}$ can be determined as follows:

$$T_{mix} = \frac{Q_{main}T_{main} + Q_{purge}T_{purge}}{Q_{main} + Q_{purge}}$$

Where $Q_{main}$ is the downstream plasma gas flow, $Q_{purge}$ is the purge gas flow, $T_{main}$ is the downstream plasma gas temperature and $T_{purge}$ is the plasma gas temperature.

Figure 11:
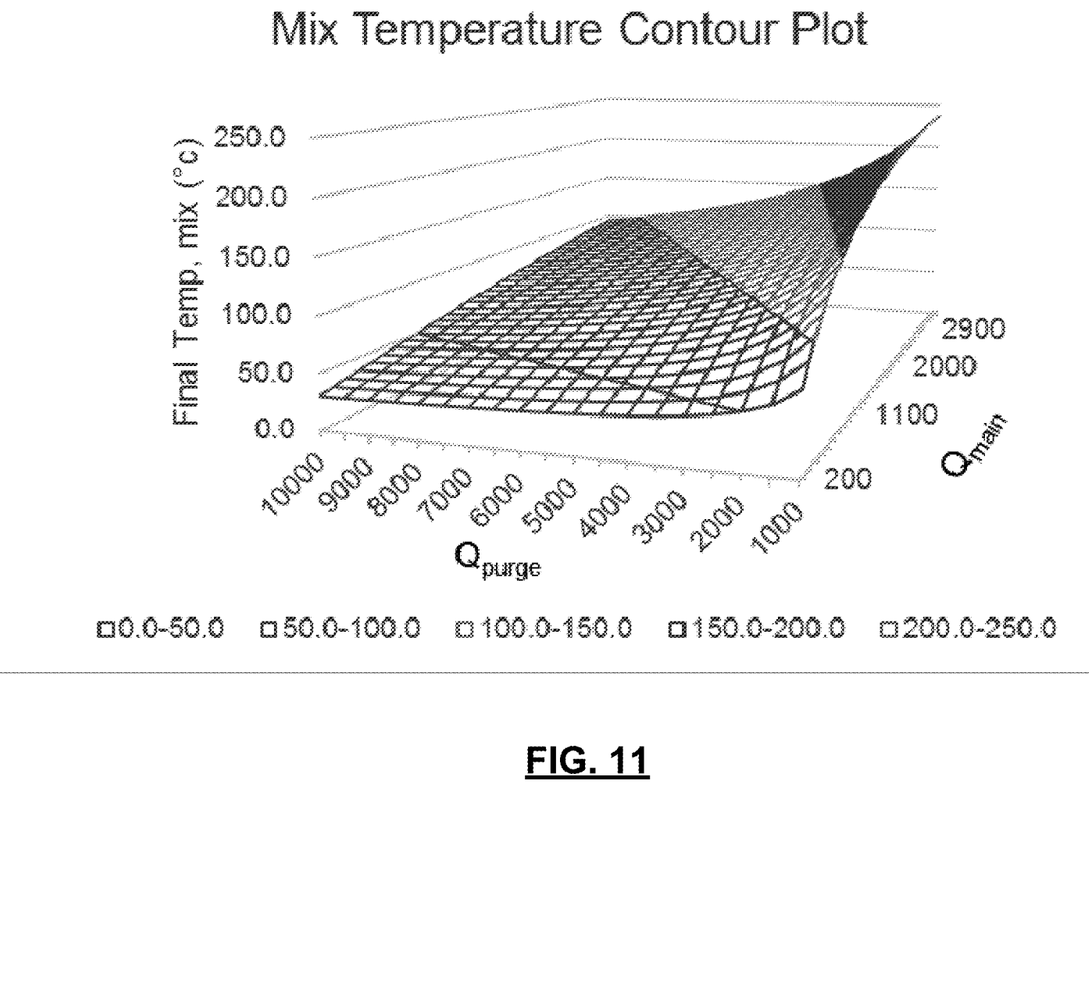
FIG. 11 is mix temperature plot according to the present disclosure.

Referring now to FIG. 11, examples of plasma gas flow rates and purge gas flow rates are shown where the plasma gas has a temperature of 300° C. and the purge gas has a temperature of 25° C.

A gap g between the substrate 126 and a bottom surface of the gas distribution device 114 can be increased as compared to prior designs. In some examples, the gap is in a range from 20 mm to 80 mm. In general, increasing the gap tends to reduce high energy species reaching the wafer surface.

Using the higher S/V ratio in combination with other features described herein can be used to reduce the plasma energy to less than 1 eV. The lower plasma energy achieved using these features compares favorably to higher plasma energy (in the range from 1 eV to 5 eV) for downstream plasma without the features described herein. As a result, film loss is significantly reduced from about 10 Angstroms for the downstream plasma without the foregoing features to less than 2 Angstroms (or 1 monolayer) with these features.

Figure 12:
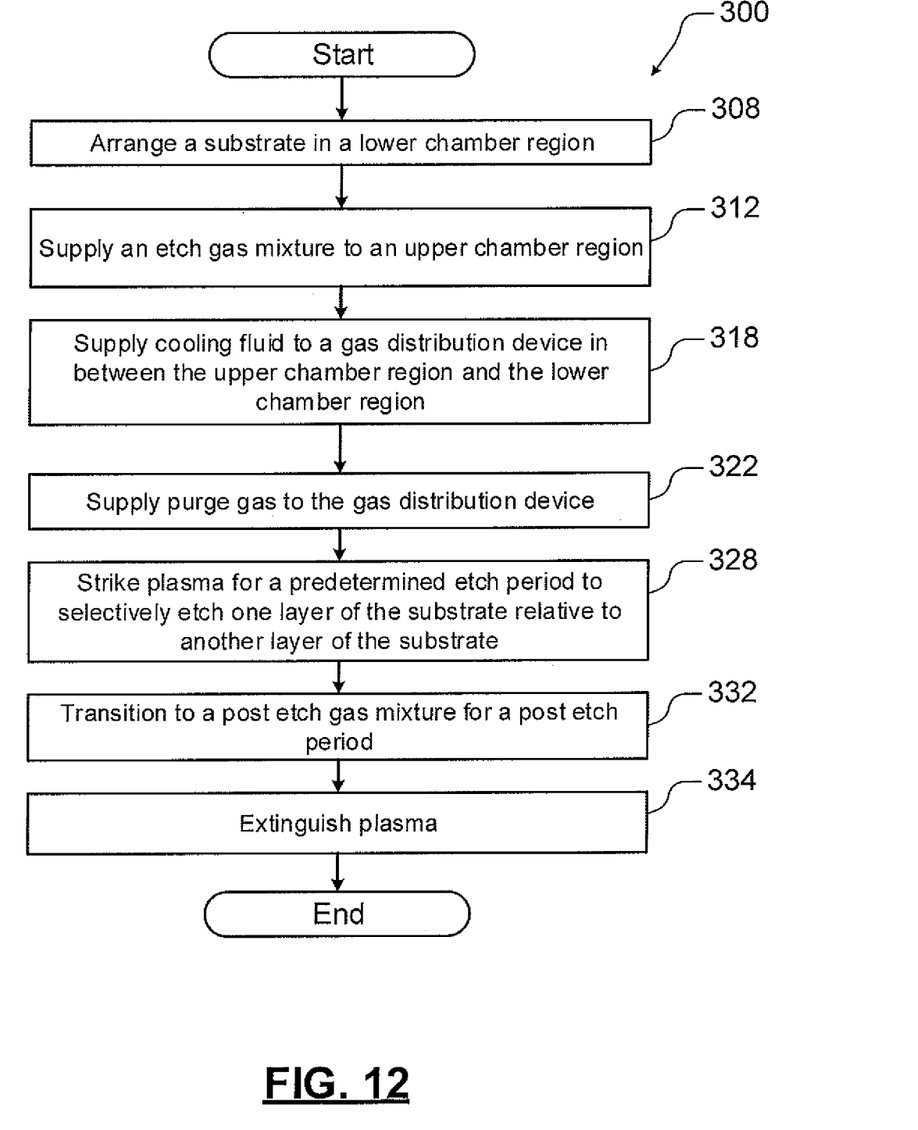
FIG. 12 is a flowchart illustrating an example of a method for selectively etching one layer of a substrate relative to at least one other exposed layer of the substrate.

Referring now to FIG. 12, a method 300 for selectively etching one layer of the substrate relative to one or more other exposed layers of the substrate is shown. At 308, a substrate is arranged in a lower chamber region of a substrate processing system. At 312, an etch gas mixture is supplied to an upper chamber region. At 318, cooling fluid is supplied to a gas distribution device in between the upper chamber region and the lower chamber region. At 322, a purge gas is supplied to the gas distribution device. At 328, plasma is struck in the upper chamber for a predetermined etch period to selectively etch one layer of the substrate relative to another layer of the substrate. At 332, the etch gas mixture is transitioned to a post etch gas mixture for a predetermined post etch period. At 334, the plasma is extinguished.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system for selectively etching a layer on a substrate, comprising:
    an upper chamber region;
    an inductive coil arranged around the upper chamber region;
    a lower chamber region including a substrate support to support a substrate;
    a gas distribution device arranged between the upper chamber region and the lower chamber region and including a plate with a plurality of holes in fluid communication with the upper chamber region and the lower chamber region, wherein a ratio of a surface area of the holes to a volume of the holes is greater than or equal to 4 (centimeters$^{-1}$);
    a radio frequency (RF) generator to supply RF power to the inductive coil;
    a gas delivery system to selectively supply gas mixtures; and
    a controller configured to cause the gas delivery system to selectively supply an etch gas mixture to the upper chamber region and to strike plasma in the upper chamber region and selectively etch a silicon nitride layer of the substrate that is exposed to the plasma relative to an epitaxial-silicon (epi-Si) layer of the substrate that is exposed to the plasma,
    wherein a gap between a lower surface of the gas distribution device and an upper surface of the substrate during the etching is 20 mm to 80 mm.

2. The substrate processing system of claim 1, wherein the plate includes a cooling plenum for circulating fluid in the gas distribution device to control a temperature of the gas distribution device, and a purge gas plenum to direct purge gas through the gas distribution device into the lower chamber region.

3. The substrate processing system of claim 2, wherein the controller is further configured to transition the plasma to a post etch gas mixture after a predetermined etch period and wherein the post etch gas mixture includes a hydrogen species and an oxide species.

4. The substrate processing system of claim 3, wherein the controller is configured to transition the plasma from the etch gas mixture to the post etch gas mixture without extinguishing the plasma.

5. The substrate processing system of claim 1, wherein a thickness of the plate is in a range from 5 mm to 25 mm, a diameter of the holes is in a range from 1 mm to 5 mm, a number of the holes is in a range from 100 to 5000, and a diameter of the plate is in a range from 6" to 20".

6. The substrate processing system of claim 1, wherein the etch gas mixture includes gases promoting nitride etch and passivation of at least one of silicon (Si), silicon germanium (SiGe) and oxide.

7. The substrate processing system of claim 6, wherein the gases promoting nitride etch include one or more gases selected from a group consisting of nitrogen trifluoride ($NF_3$), difluoromethane ($CH_2F_2$), tetrafluoromethane ($CF_4$), fluoromethane ($CH_3F$), a combination of molecular oxygen, molecular nitrogen, and nitrous oxide ($O_2/N_2/N_2O$), and combinations thereof.

8. The substrate processing system of claim 6, wherein the gases promoting passivation include one or more gases selected from a group consisting of fluoromethane ($CH_3F$), difluoromethane ($CH_2F_2$), a combination of molecular oxygen, molecular nitrogen, and nitrous oxide ($O_2/N_2/N_2O$), methane ($CH_4$), carbonyl sulfide (COS), hydrogen sulfide ($H_2S$) and combinations thereof.

9. A substrate processing system for selectively etching a layer on a substrate, comprising:
    a substrate processing chamber including:
        an upper chamber region;
        a lower chamber region including a substrate support to support a substrate; and
        a gas distribution device arranged between the upper chamber region and the lower chamber region and including a plurality of holes in fluid communication with the upper chamber region and the lower chamber region,
        wherein a ratio of a surface area of the holes to a volume of the holes is greater than or equal to 4 (centimeters$^{-1}$),
        wherein the gas distribution device includes:
            an annular radially-outer portion;

a cooling plenum formed in the annular radially-outer portion and to circulate fluid around a periphery of the gas distribution device and control a temperature of the gas distribution device; and a purge gas plenum to direct purge gas from the gas distribution device in a direction into the lower chamber region towards the substrate support; and a controller configured to selectively enable purge gas flow to the purge gas plenum and to supply plasma to the upper chamber region and selectively etch a silicon nitride layer of the substrate that is exposed to the plasma relative to at least one other layer of the substrate that is exposed to the plasma, the at least one other layer of the substrate selected from a group consisting of silicon dioxide ($SiO_2$), silicon oxycarbonitride (SiOCN), silicon germanium (SiGe), amorphous silicon (a-Si), and epitaxial-silicon (epi-Si), wherein the controller is configured to, during the etching of the silicon nitride layer of the substrate relative to the at least one other layer of the substrate, control purge gas flow and plasma gas flow such that a temperature of a mixture of the purge gas and the plasma gas within the upper chamber region is less than 100 degrees Celsius.

10. The substrate processing system of claim 9, wherein a thickness of the gas distribution device is in a range from 5 mm to 25 mm and a diameter of the holes is in a range from 1 mm to 5 mm.

11. The substrate processing system of claim 9, wherein a number of the holes is in a range from 100 to 5000 and a diameter of the gas distribution device is in a range from 6" to 20".

12. The substrate processing system of claim 9, wherein the controller is configured to generate the plasma using a plasma gas mixture including gases promoting nitride etch and promoting passivation of at least one of silicon (Si), silicon germanium (SiGe) and oxide.

13. The substrate processing system of claim 9, wherein:

the gases promoting nitride etch include one or more gases selected from a group consisting of nitrogen trifluoride ($NF_3$), difluoromethane ($CH_2F_2$), tetrafluoromethane (CFO, fluoromethane ($CH_3F$), a combination of molecular oxygen, molecular nitrogen, and nitrous oxide ($O_2/N_2/N_2O$), and combinations thereof; and the gases promoting passivation include one or more gases selected from a group consisting of fluoromethane ($CH_3F$), difluoromethane ($CH_2F_2$), methane ($CH_4$), carbonyl sulfide (COS), hydrogen sulfide ($H_2S$), a combination of molecular oxygen, molecular nitrogen, and nitrous oxide ($O_2/N_2/N_2O$), and combinations thereof.

* * * * *